(12) United States Patent
Suzuki et al.

(10) Patent No.: US 9,368,557 B2
(45) Date of Patent: Jun. 14, 2016

(54) DISPLAY DEVICE AND ELECTRONIC DEVICE

(71) Applicant: Sony Corporation, Tokyo (JP)

(72) Inventors: Mamoru Suzuki, Kanagawa (JP); Seonghee Noh, Kanagawa (JP); Masato Nakamura, Tokyo (JP); Seiichiro Jinta, Kanagawa (JP); Gaku Izumi, Tokyo (JP); Shinichi Teraguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/453,713

(22) Filed: Aug. 7, 2014

(65) Prior Publication Data

US 2015/0048345 A1 Feb. 19, 2015

(30) Foreign Application Priority Data

Aug. 15, 2013 (JP) .................................. 2013-168883

(51) Int. Cl.
| | |
|---|---|
| *H01L 27/32* | (2006.01) |
| *H01L 51/52* | (2006.01) |
| *G02F 1/1335* | (2006.01) |

(52) U.S. Cl.
CPC ........ *H01L 27/322* (2013.01); *G02F 1/133514* (2013.01); *H01L 51/5281* (2013.01); *H01L 27/3213* (2013.01)

(58) Field of Classification Search
CPC .......................... H01L 27/322; H01L 27/3213
See application file for complete search history.

(56) References Cited

U.S. PATENT DOCUMENTS

| | | | | |
|---|---|---|---|---|
| 9,111,882 | B1* | 8/2015 | Chen | ..................... H01L 27/322 |
| 2007/0090751 | A1* | 4/2007 | Cok | ..................... H01L 27/3213 313/501 |
| 2011/0134019 | A1* | 6/2011 | Lee | ..................... H01L 27/3213 345/76 |
| 2011/0198629 | A1* | 8/2011 | Lee | ..................... H01L 27/3213 257/89 |
| 2012/0032583 | A1* | 2/2012 | Kim | ..................... H01L 27/322 313/504 |
| 2014/0111748 | A1* | 4/2014 | Nakamura | ........ G02F 1/133611 349/108 |
| 2014/0231790 | A1* | 8/2014 | Fujino | .................. H01L 27/322 257/40 |

FOREIGN PATENT DOCUMENTS

| | | |
|---|---|---|
| JP | 10-048752 A | 2/1998 |
| JP | 2010-243769 A | 10/2010 |
| JP | 2013-097287 A | 5/2013 |

* cited by examiner

*Primary Examiner* — Marvin Payen
*Assistant Examiner* — Jeremy Joy
(74) *Attorney, Agent, or Firm* — Wolf, Greenfield & Sacks, P.C.

(57) ABSTRACT

There is provided a display device including a light-emitting element corresponding to a pixel for a color, and a white color filter corresponding to a white pixel. Transmittance of the white color filter is based on neutral density (ND) transmittance that is uniform throughout an entire wavelength band of visible light, and transmittance in a particular wavelength band in the entire wavelength band of the visible light is decreased to be lower than the ND transmittance.

16 Claims, 18 Drawing Sheets

DISPLAY DEVICE AND ELECTRONIC DEVICE

CROSS REFERENCE TO RELATED APPLICATIONS

This application claims the benefit of Japanese Priority Patent Application JP 2013-168883 filed Aug. 15, 2013, the entire contents of which are incorporated herein by reference.

BACKGROUND

The present disclosure relates to a display device and an electronic device.

There have recently been used display devices each configured to display video and including organic electroluminescence (EL) light-emitting elements. Since a large amount of reflected external light deteriorates the display quality in such display devices, it is preferable to reduce the external light reflection. General display panels have external light reflection components mainly divided into two. One is a component of Fresnel reflection occurring at an interface between a member of the outermost surface of the panel, and the other is a reflection component that is light entering and then going out of the panel.

SUMMARY

General organic EL panels each have a light-emitting body formed by stacking a transparent electrode, an organic light-emitting layer, and a metal electrode on a transparent substrate. For this reason, light entering the organic EL panel is reflected on the metal electrode and then goes out of the panel. In addition, high transmittance of component members other than color filters prevents light from being absorbed sufficiently and causes the light to go out of the panel, resulting in a large amount of reflection components. Accordingly, the organic EL panel has trouble of a large amount of reflection component that is the aforementioned second component.

In particular, organic EL panels having white pixels that are colorless and transparent have a slight amount of components absorbed by color filters, and thus has trouble of remarkably increased external light reflection. Moreover, the external light entering each organic EL panel has a changed wavelength spectrum when going out of the organic EL panel, and thus the organic EL panel has trouble of reflected external light seen as colored light.

In the external light reflection that is the aforementioned first component, it is possible to reduce the external light reflection, for example, by performing AR (Anti-Reflective) coating on a panel surface or by inserting an AG (Anti-Glare) film.

As a countermeasure for reducing the external light reflection that is the second component, there is a method by which a circularly polarizing plate is provided on a surface of the organic EL panel as described in JP H10-48752A and JP 2010-243769A. However, the circularly polarizing plate transmits light emitted from an organic EL element (hereinafter, referred to as organic-EL intrinsic light in some cases), and thus the brightness of the organic-EL intrinsic light is decreased to half in comparison with a case without the circularly polarizing plate. This causes trouble of power consumption increase.

There is also a method in which only an aperture ratio of white pixels is decreased or the white pixels are each provided with a neutral density (ND) filter, as described in JP 2013-97287A. However, it is not possible to prevent change of the color of reflected light in this method, and thus there still exists the trouble of the hue change of the reflected light.

Hence, it is desired to minimize external light reflection in a display device and desirably control the color of the reflected external light.

According to an embodiment of the present disclosure, there is provided a display device including a light-emitting element corresponding to a pixel for a color, and a white color filter corresponding to a white pixel. Transmittance of the white color filter is based on neutral density (ND) transmittance that is uniform throughout an entire wavelength band of visible light, and transmittance in a particular wavelength band in the entire wavelength band of the visible light is decreased to be lower than the ND transmittance.

According to another embodiment of the present disclosure, there is provided an electronic device including a display device including a light-emitting element corresponding to a pixel for a color, and a white color filter corresponding to a white pixel. The white color filter is based on neutral density (ND) transmittance that is uniform throughout an entire wavelength band of visible light, and transmittance in a particular wavelength band in the entire wavelength band of the visible light is decreased to be lower than the ND transmittance.

The transmittance in the particular wavelength band may be decreased to be lower than the ND transmittance of the white color filter by adding a coloring agent to the white color filter.

The ND transmittance may be 50% or higher.

The entire wavelength band of the visible light may range from 400 nm to 700 nm.

The white color filter may be colored in one of red, green, and blue or in one of complementary colors of red, green, and blue.

A ratio of a maximum value to a minimum value of spectral transmittance in the entire wavelength band of the visible light may be 0.44 or higher in the white color filter.

A color difference $\Delta u'v'$ may be 0.02 or lower, the color difference $\Delta u'v'$ being between organic-electroluminescence (EL) intrinsic light emitted from the light-emitting element that is an organic EL element and transmitted through the white color filter and organic-EL intrinsic light transmitted through a colorless and transparent white color filter having ND transmittance that is uniform throughout the entire wavelength band of the visible light.

An aperture ratio of the white pixel corresponding to the white color filter may be different from aperture ratios of red, green, and blue pixels.

The aperture ratio of the white pixel corresponding to the white color filter may be lower than the aperture ratios of red, green, and blue pixels.

The aperture ratio of the white pixel corresponding to the white color filter may be higher than the aperture ratios of red, green, and blue pixels.

According to the embodiments of the present disclosure described above, it is possible to minimize the external light reflection in the display device and desirably control the color of the reflected external light.

Note that the advantageous effects described above are not necessarily limited, and any of advantageous effects described in the specification or other advantageous effects known from the specification may be exerted in addition to or instead of the advantageous effects described above.

DETAILED DESCRIPTION OF THE EMBODIMENTS

Figure 1:
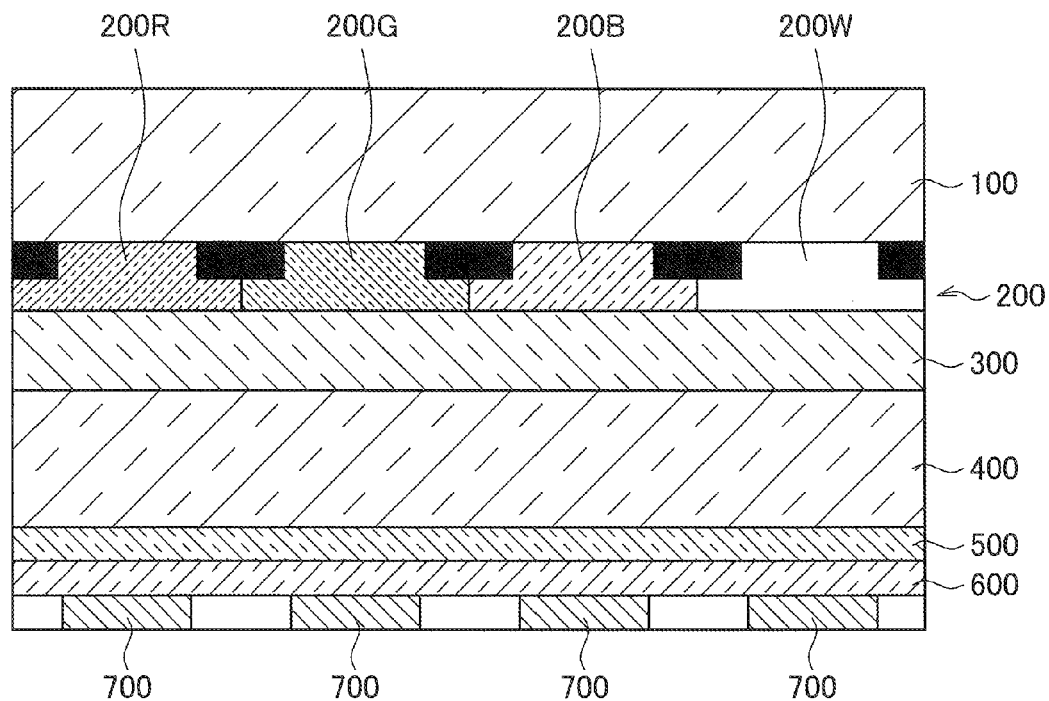
FIG. 1 is a schematic diagram illustrating a structure of an organic EL panel.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that descriptions will be given in the following order.
1. First Embodiment
1.1. Structure Example of Organic EL Panel
1.2. Absolute Reflectance of External Light Reflection and Color of Reflected Light
1.3. Hue Control by Adding Coloring Agent
1.4. Allowable Range of Color Change
2. Second Embodiment
3. Third Embodiment
4. Fourth Embodiment
5. Fifth Embodiment
<1.First Embodiment>
1.1. Structure Example of Organic EL Panel FIG. 1 is a cross-sectional diagram illustrating an organic EL panel 1000 according to an embodiment of the present disclosure. Note that a description is given below by taking the organic EL panel 1000 as an example, but the embodiment of the present disclosure is applicable to not only the organic EL panel 1000 but also a liquid crystal display panel (LCD). As illustrated in FIG. 1, the organic EL panel 1000 includes a glass plate 100, a color filter 200, a resin layer 300, a protective layer 400, a transparent electrode 500, an organic EL element 600, and a metal electrode 700 in this order from the uppermost layer. The color filter 200 includes a color filter 200R in red (R), a color filter 200G in green (G), a color filter 200B in blue (B), and a color filter 200W in white (W). The color filters 200R, 200G, 200B, and 200W are provided to correspond to red, green, blue, and white pixels, respectively.

Figure 2:
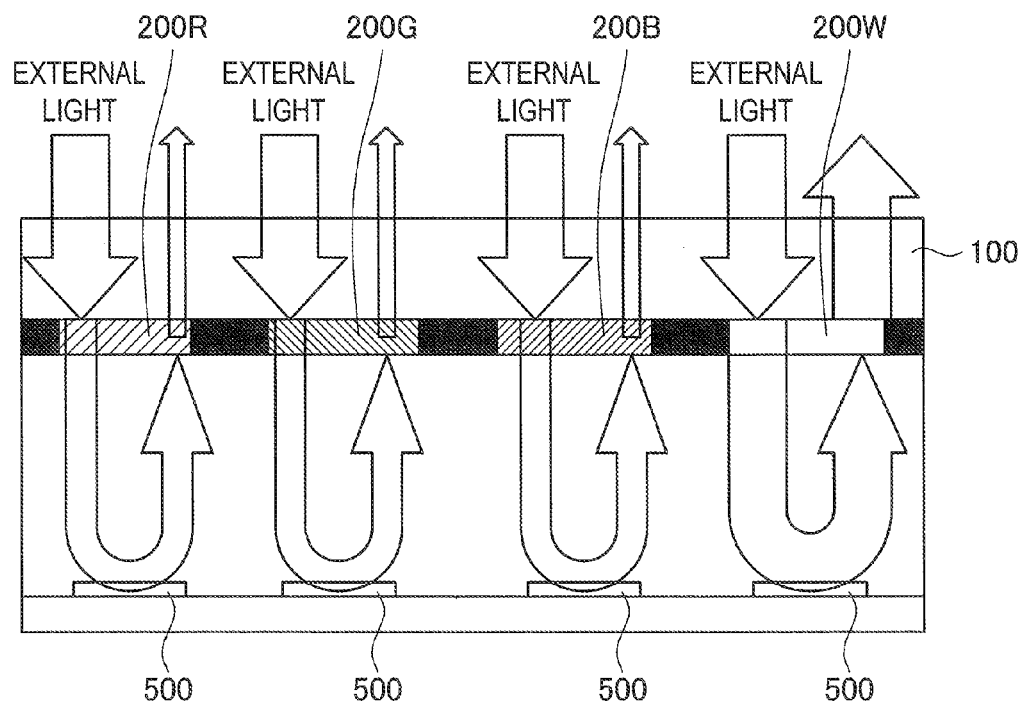
FIG. 2 is a schematic diagram illustrating how light entering the organic EL panel having red, green, blue, and white color filters goes out of the panel.

FIG. 2 is a schematic diagram illustrating how light entering the organic EL panel 1000 goes out, the organic EL panel 1000 having the red, green, blue, and white color filters 200R, 200G, 200B, and 200W. Since the external light entering the organic EL panel 1000 passes through the color filter 200 two times, the intensity of the light becomes approximately the second power of the color filter transmittance. The red, green, and blue color filters 200R, 200G, and 200B absorb the light to some extent, while the color filter 200W absorbs a very small amount of light and causes a large amount of external light reflection because of its high transmittance.

Moreover, there is trouble of not only the increase of the external light reflection but also reflected external light seen as colored light. Specifically, the external light entering the organic EL panel 1000 has a particular wavelength component highly likely to be absorbed depending on the structure or the material of the organic EL panel 1000, and thus has a changed wavelength spectrum when going out of the organic EL panel 1000.

1.2. Absolute Reflectance of External Light Reflection and Color of Reflected Light Here, the thicknesses of layers in the structure in FIG. 1 are set, and the absolute reflectance of the external light reflection and the color of reflected light are calculated in an organic EL panel having the red, green, blue, and white pixels of which aperture ratios are each 32%. The glass layer has a thickness of 1 mm; the color filters (RGBW), 3 μm; the resin layer, 3 μm; the protective layer, 3 μm; the transparent electrode, 0.2 μm, the organic EL element, 0.3 μm; and an aluminum layer, 0.01 μm. Note that the aperture ratio indicates the percentage of a region effectively lighting in one pixel. The aperture ratio can be controlled by using, for example, a window of the organic EL panel 1000 or a black matrix of the color filters.

Figure 3:
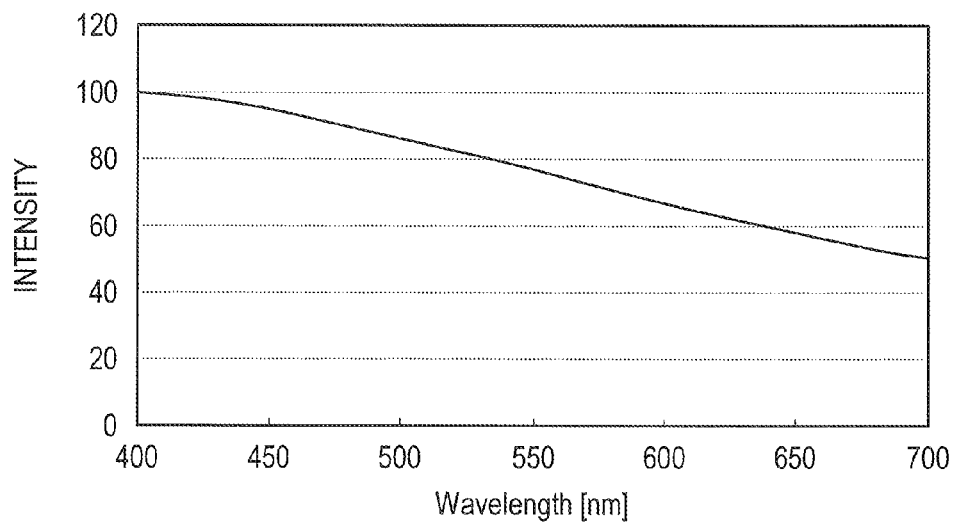
FIG. 3 is a characteristic chart illustrating an external-light wavelength spectrum used for calculation.
Figure 4:
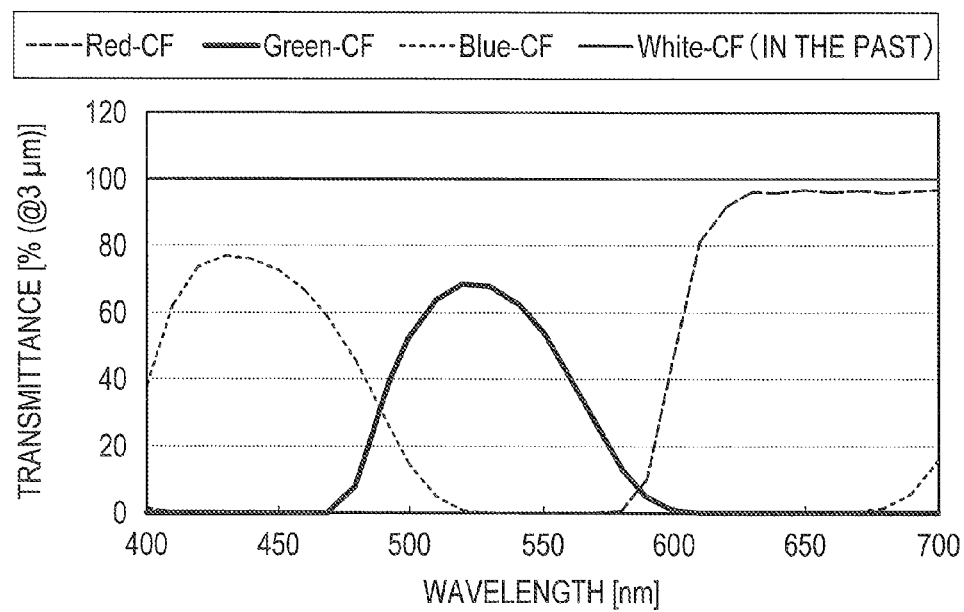
FIG. 4 is a characteristic chart illustrating spectral transmittances of the red, green, and blue color filters, respectively.

FIG. 3 is a characteristic chart illustrating an external-light wavelength spectrum used for the calculation. Calculations to be described later also use the external light having the wavelength spectrum illustrated in FIG. 3 as reference external light. FIG. 4 illustrates spectral transmittances of the red, green, and blue color filters 200R, 200G, and 200B, and the calculations to be described later also use these values. In FIG. 4, Red-CF denotes the spectral transmittance of the color filter 200R; Green-CF, the color filter 200G; and Blue-CF, the color filter 200B.

Figure 5:
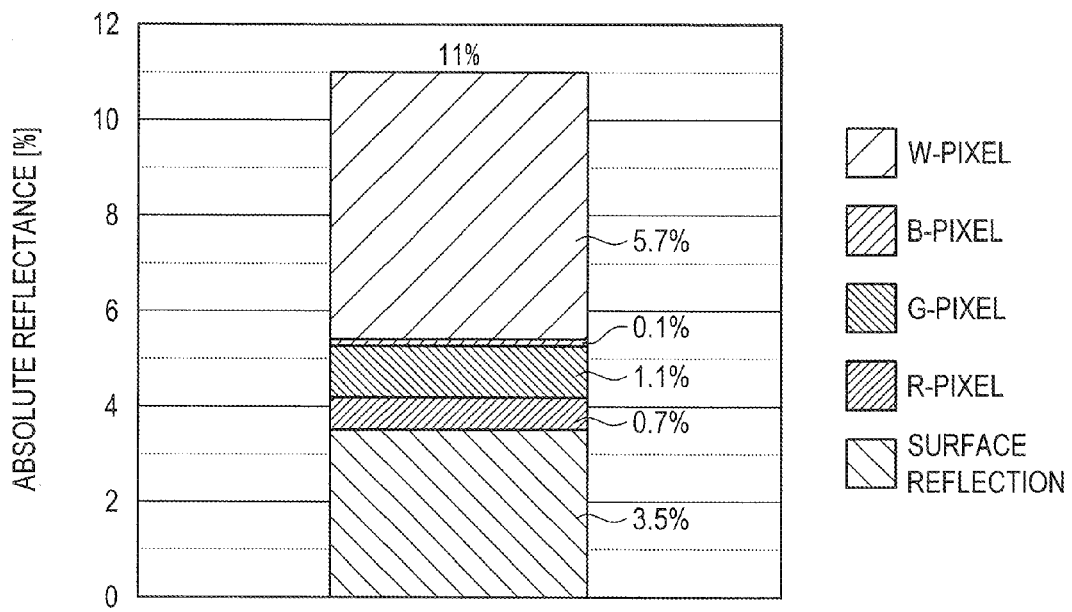
FIG. 5 is a characteristic chart illustrating an absolute reflectance of external light and the breakdown of a calculation result.
Figure 6:
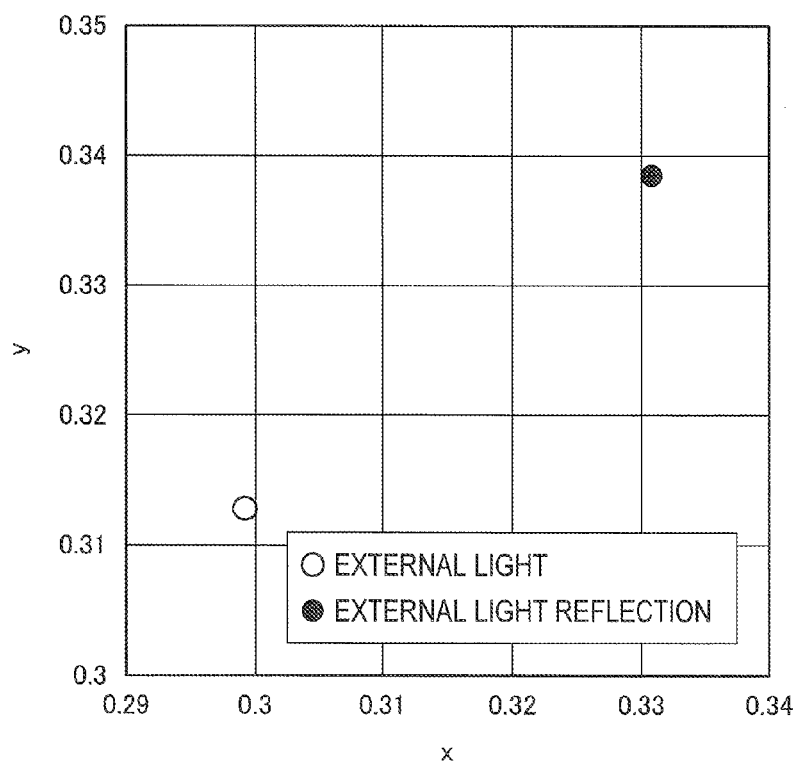
FIG. 6 is a characteristic chart (a chromaticity chart) illustrating xy chromaticities of the external light and reflected external light.

FIG. 5 is a characteristic chart illustrating an absolute reflectance of the external light and the breakdown of a calculation result. FIG. 6 is a characteristic chart (a chromaticity chart) illustrating xy chromaticities of the external light and reflected external light.

As illustrated in FIG. 5, the absolute reflectance (the percentage of reflected light relative to incident light) of the external light is 11%, and a breakdown is as follows. A component of the Fresnel reflection on the uppermost glass surface has an absolute reflectance of 3.5%; a component of the external light entering and then going out of the red pixel, 0.7%; a component of the external light entering and then going out of the green pixel, 1.1%; a component of the external light entering and then going out of the blue pixel, 0.7%; and a component of the external light entering and then going out of the white pixel, 5.7%. It is learned that the light reflected on the white pixel accounts for one second or more of the external light reflection components. Meanwhile, according to the xy chromaticity chart as illustrated in FIG. 6, the reflected light shifts from the external light in a yellow direction. This is because the organic EL panel 1000 generally includes a large amount of material that absorbs many components in a short wavplementary color of blue.

The present embodiment focuses on the reduction of the second reflected light component described above. The external light reflection from the white pixel is reduced while minimizing influence on intrinsic light in the organic EL panel 1000, and the hue of the external light is controlled. Thus, the reflectance of the external light is decreased by decreasing the ND transmittance of the color filter 200W (the white color filter), and the color of the reflected light is changed to a desired color by coloring the color filter 200W.

Note that the ND transmittance is defined as follows. The ND transmittance means a transmittance decreased uniformly throughout the entire wavelength band of visible light and does not influence the hue. For example, the ND transmittance of 70% means that the transmittance is 70% throughout the entire wavelength band (400 to 700 nm) of visible light.

Figure 7:
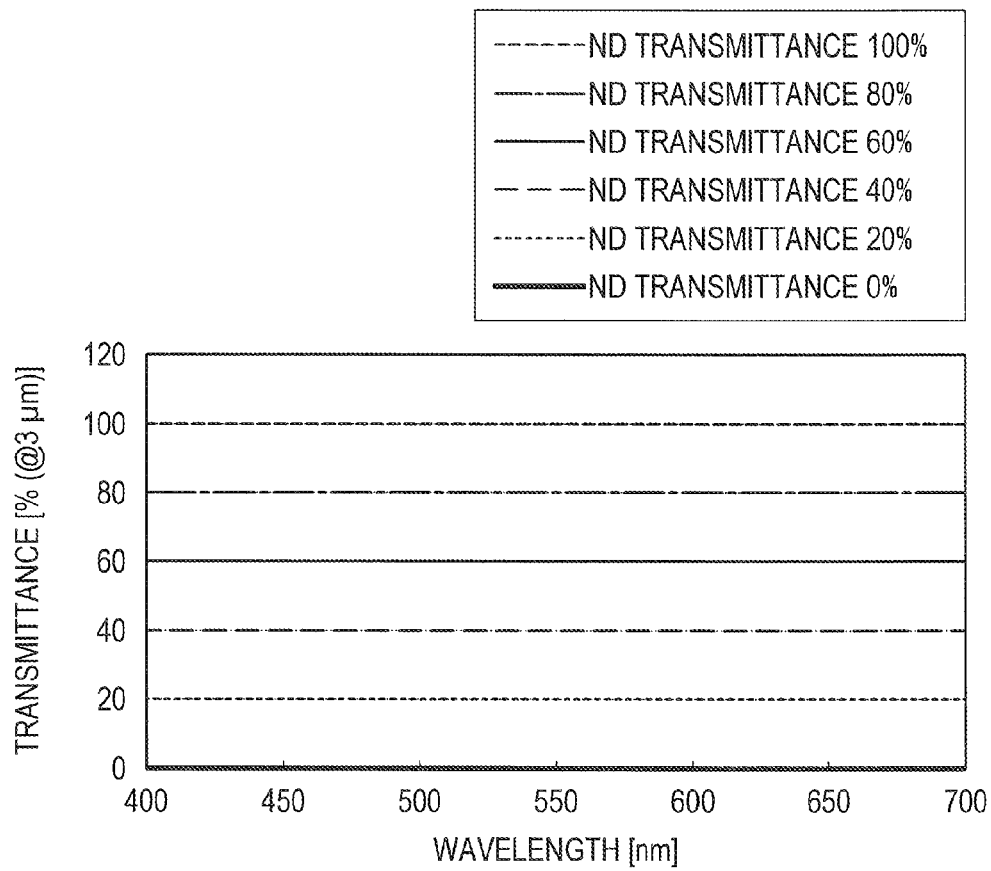
FIG. 7 is a characteristic chart illustrating ND (Neutral Density) transmittances of the white color filter that are respectively set at 100%, 80%, 60%, 40%, 20%, and 0%.
Figure 8:
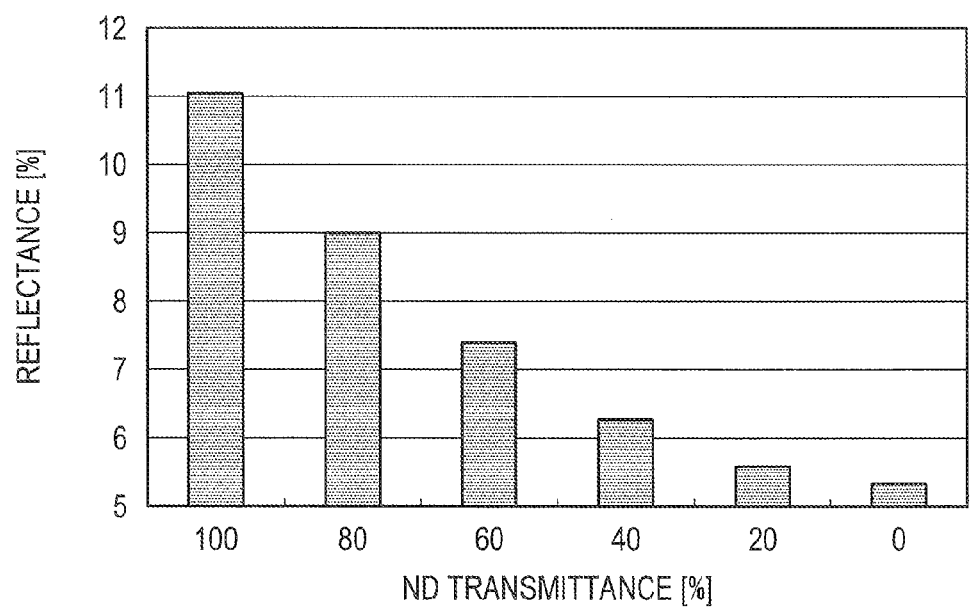
FIG. 8 is a characteristic chart illustrating absolute reflectances of the external light for the respective ND transmittances.
Figure 9:
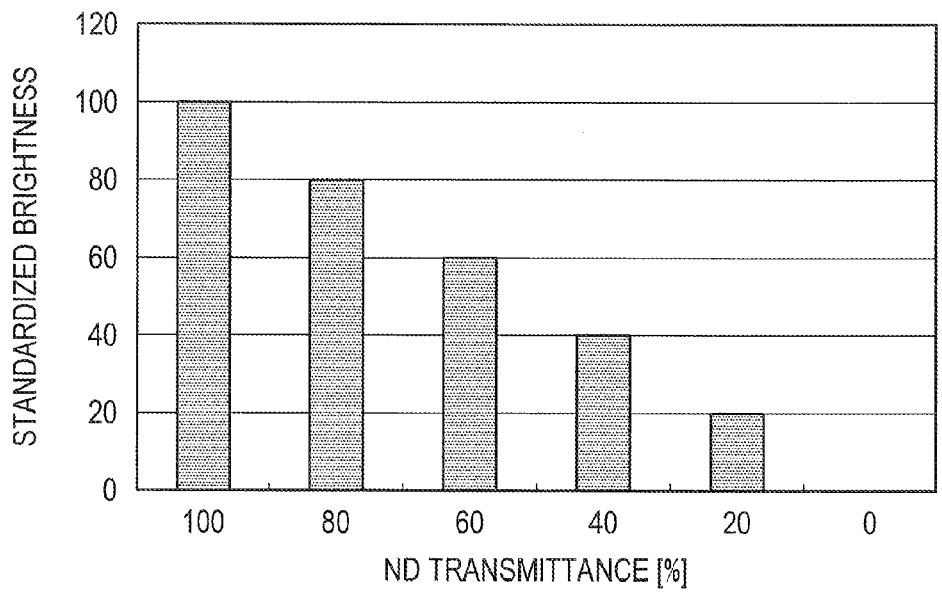
FIG. 9 is a characteristic chart illustrating standardized brightness of the organic-EL intrinsic light at the time of lighting an organic EL element for white pixel only.
Figure 10:
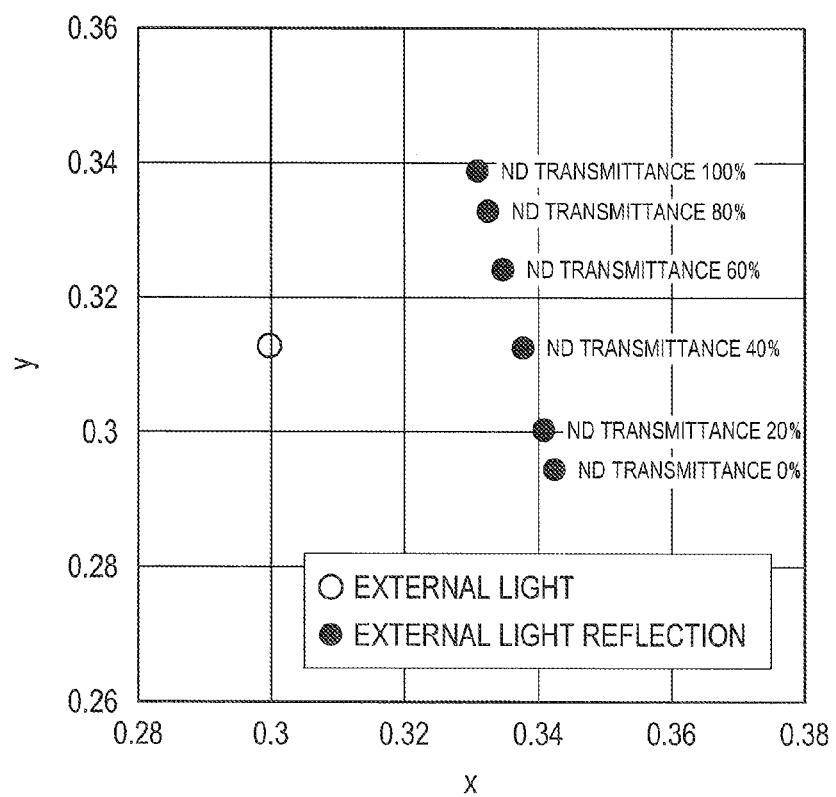
FIG. 10 is a characteristic chart illustrating xy chromaticity of the external light reflection for each ND transmittance.

Hereinafter, optimum spectrum characteristics of the color filter 200W will be described in order. As illustrated in FIG. 7, the ND transmittances of the color filter 200W are respectively set at 100%, 80%, 60%, 40%, 20%, and 0%, and the external light (the characteristic in FIG. 3) is emitted to the organic EL panel 1000. FIG. 8 is a characteristic chart illustrating absolute reflectances of the external light at this time for the respective ND transmittances. FIG. 9 is a characteristic chart illustrating standardized brightness of intrinsic light in the organic EL panel 1000 (organic-EL intrinsic light) at the time of lighting the organic EL element 600 of the white pixel only. FIG. 10 is a characteristic chart illustrating xy chromaticity of the external light reflection.

As illustrated in FIG. 8, the lower the ND transmittance is, the lower the absolute reflectance of the external light is. The absolute reflectance is exponentially decreased relative to the ND transmittance. In contrast, as illustrated in FIG. 9, the lower the ND transmittance is, the lower the standardized brightness of the organic-EL intrinsic light is. The brightness is decreased in proportion to the ND transmittance. As described above, light in the external light reflection passes the color filter 200 two times in total while entering and then going out of the color filter 200 and thereby is attenuated to have approximately the second power of the ND transmittance. In contrast, the organic-EL intrinsic light passes the color filter 200 only once when going out, and thus the brightness decrease is reduced to the first power of the ND transmittance. This means that decreasing the ND transmittance of the color filter 200W (the white color filter) can effectively reduce the external light reflection. Accordingly, to reduce the external light reflection, it is preferable to decrease the ND transmittance of the color filter 200W. This enables the external light reflection to be effectively reduced without scarifying the brightness of the organic-EL intrinsic light.

Meanwhile, as illustrated in FIG. 10, the chromaticity of the reflected light is changed by changing the ND transmittance of the color filter 200W. As described with reference to FIG. 5, the external light reflection is constituted of the Fresnel reflection on the uppermost surface of the panel and the light reflection from the red, green, blue, and white pixels, and the aforementioned types of the reflected light have different wavelength spectra. For this reason, when an amount of the reflected light from the white pixel is changed by changing the ND transmittance, the wavelength spectrum of the total external light reflection is also changed, so that the hue is changed.

The ND transmittance is preferably 50% or higher. In the aforementioned methods in which the circularly polarizing plate is attached (JP H10-48752A and JP 2010-243769A), the attaching the circularly polarizing plate causes decrease of the transmittance, and thus it is difficult to ensure the transmittance of 50%. Thus, setting the ND transmittance at 50% or higher can ensure transmittance higher than in the case of attaching the circularly polarizing plate, and thus the brightness decrease of the organic-EL intrinsic light can be prevented, so that power consumption can be reduced.

1.3. Hue Control by Adding Coloring Agent

Next, a method for controlling the hue of the external light reflection by adding a coloring agent will be described by taking as an example a case where the ND transmittance of the color filter 200W is 80%. Note that the coloring agent to be added causes decrease of the transmittance in only a particular wavelength band and does not cause change of the transmittance in the other irrelevant wavelength bands. In other words, the ND transmittance is used to decrease the transmittance in the entire wavelength band to 80%, and a coloring agent is used to decrease the transmittance in only a particular wavelength band.

Figure 11:
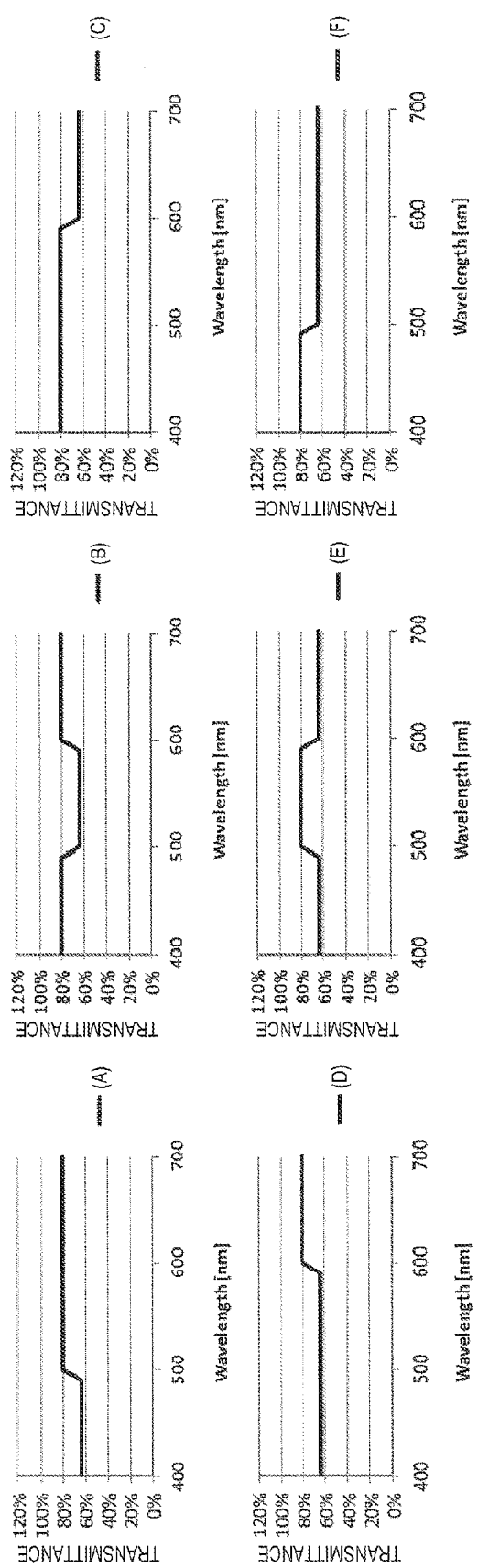
FIG. 11 is a characteristic chart illustrating an example in which spectral transmittances of white color filters (A) to (F) are set by mixing six typical coloring agents with the white color filters (A) to (F) each having an ND transmittance of 80%.

Assume a case where six typical types of coloring agents are mixed with color filters 200W (A) to (F) each having the ND transmittance of 80% so that the color filters 200W (A) to (F) can obtain spectral transmittances as illustrated in FIG. 11. The color filters 200W (A) to (F) respectively have colors of: (A) faint yellow obtained by decreasing the transmittance of a 400-500 nm band; (B) faint magenta obtained by decreasing the transmittance of a 500-600 nm band; (C) faint cyan obtained by decreasing the transmittance of a 600-700 nm band; (D) faint red obtained by decreasing the transmittance of a 400-600 nm band; (E) faint green obtained by decreasing the transmittances of the 400-500 nm band and a 600-700 nm band; and (F) faint blue obtained by decreasing the transmittance of a 500-700 nm band. Since the ND transmittance is 80%, the maximum transmittance value in a 400-700 nm band is 80% in each of the color filters 200W (A) to (F).

Figure 12:
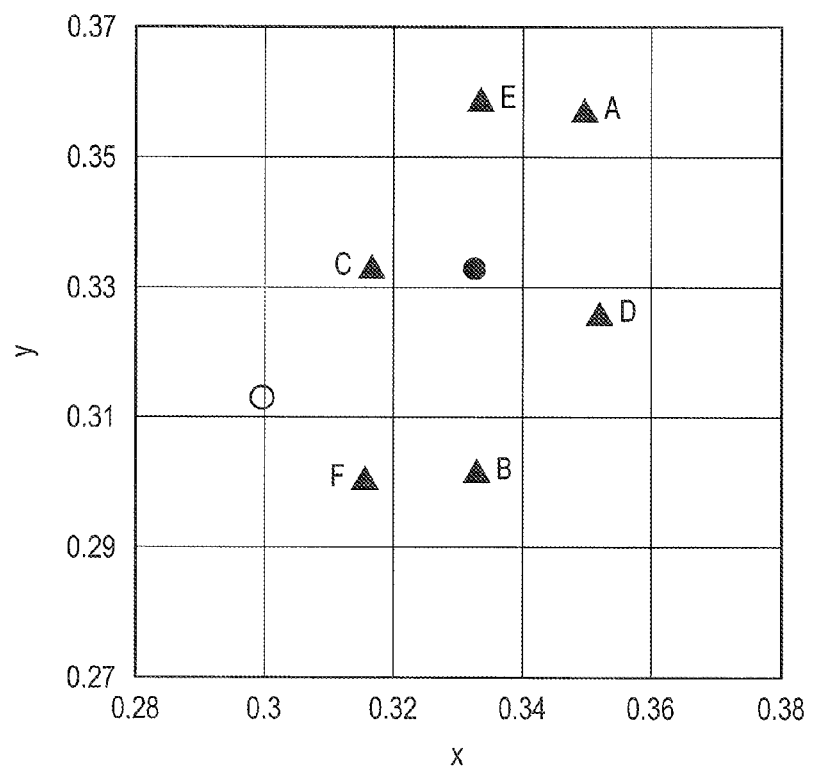
FIG. 12 is a characteristic chart illustrating xy chromaticities of external light reflection in the use of the white color filters (A) to (F) having the spectral transmittances in FIG. 11.
Figure 13:
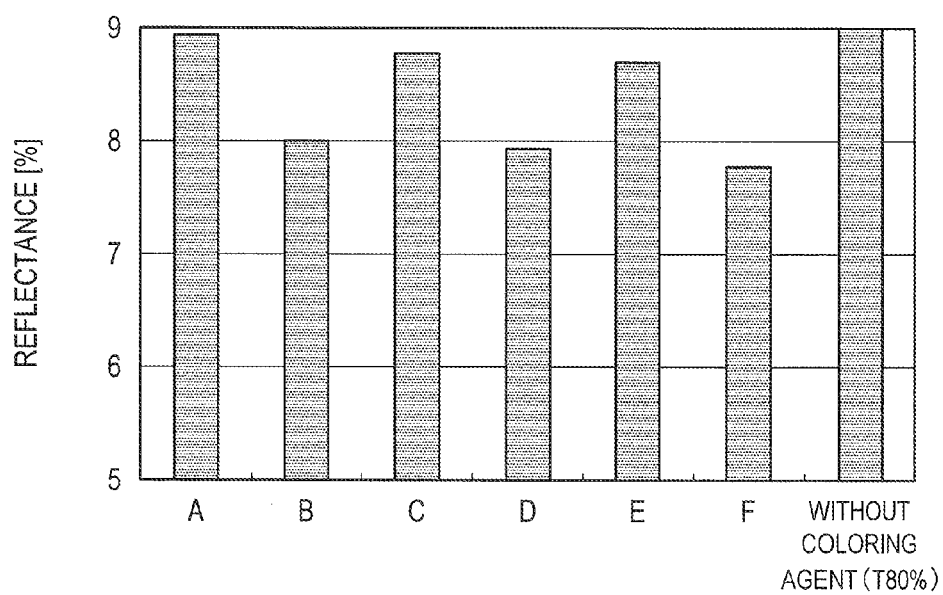
FIG. 13 is a characteristic chart illustrating absolute reflectances of the external light in the use of the white color filters (A) to (F)

FIG. 12 is a characteristic chart illustrating xy chromaticities of the external light reflection in the use of the white color filters 200W ((A) to (F)) having these spectral transmittances. FIG. 12 shows as reference data an xy chromaticity of external light (a white circle) and a result of using a colorless color filter 200W (no coloring agent added) having the ND transmittance of 80% (a black circle). FIG. 13 is a characteristic chart illustrating absolute reflectances of the external light in the use of the color filters 200W ((A) to (F)). FIG. 13 shows as reference data a result (without coloring agent) of using the colorless color filter 200W (no coloring agent added) having the ND transmittance of 80%. As illustrated in FIG. 12, it is learned that the color of the reflected light can be freely controlled by adding the coloring agent to the color filter 200W and the hue of the reflected light is shifted in directions of the colors of the coloring agents.

In addition, as illustrated in FIG. 13, it is learned that setting the color filters 200W with the respective spectral transmittances as in (B), (D), (F) leads to decrease of the absolute reflectance of the external light. This is because a coloring agent causes decrease of the transmittance around a 550 nm wavelength band having a high spectral luminous efficacy, as illustrated in FIG. 11. General organic EL panels are often made from a material absorbing short-wavelength (blue component) light, and have a characteristic that the external light reflection is apt to be shifted in a direction of a complementary color of blue, that is, yellow. For this reason, the hue of the reflected light can be restored in a direction of blue by using a blue coloring agent to be added. Further, it is possible to reduce the external light reflection effectively.

Figure 14:
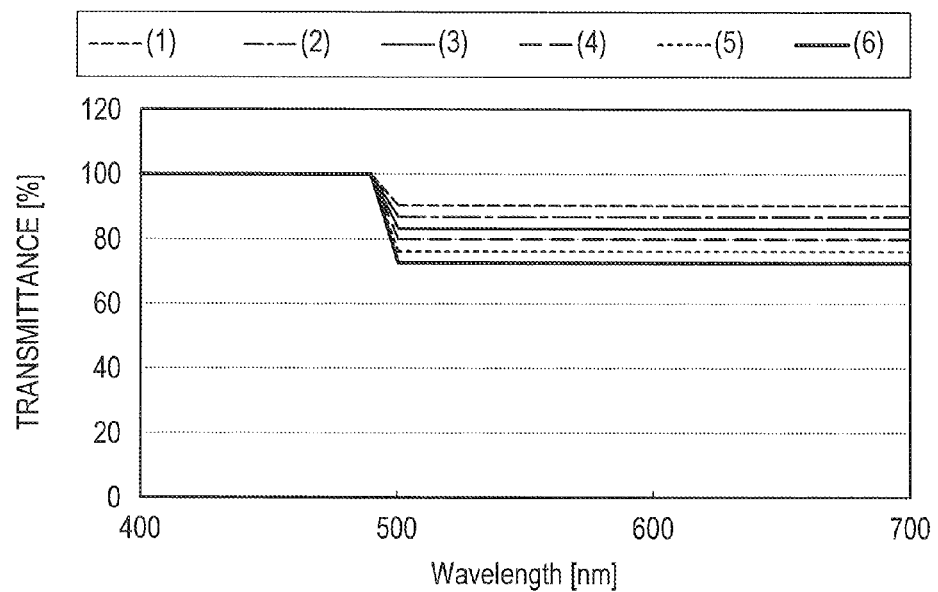
FIG. 14 is a characteristic chart illustrating relationships each between a wavelength of a corresponding one of six types of white color filters (1) to (6) and transmittance thereof, the white color filters (1) to (6) each being prepared in such a manner that the coloring agent of the white color filter (F) in FIG. 11 has an increased density.

FIG. 14 is a characteristic chart illustrating relationships each between a wavelength of a corresponding one of six types of the color filters 200W ((1) to (6)) and transmittance thereof, the color filters 200W ((1) to (6)) each being prepared in such a manner that the coloring agent (faint blue) of the white color filter 200W (F) in FIG. 11 (1) has a density increased in the order from (2), (3), (4), (5), and (6).

Figure 15:
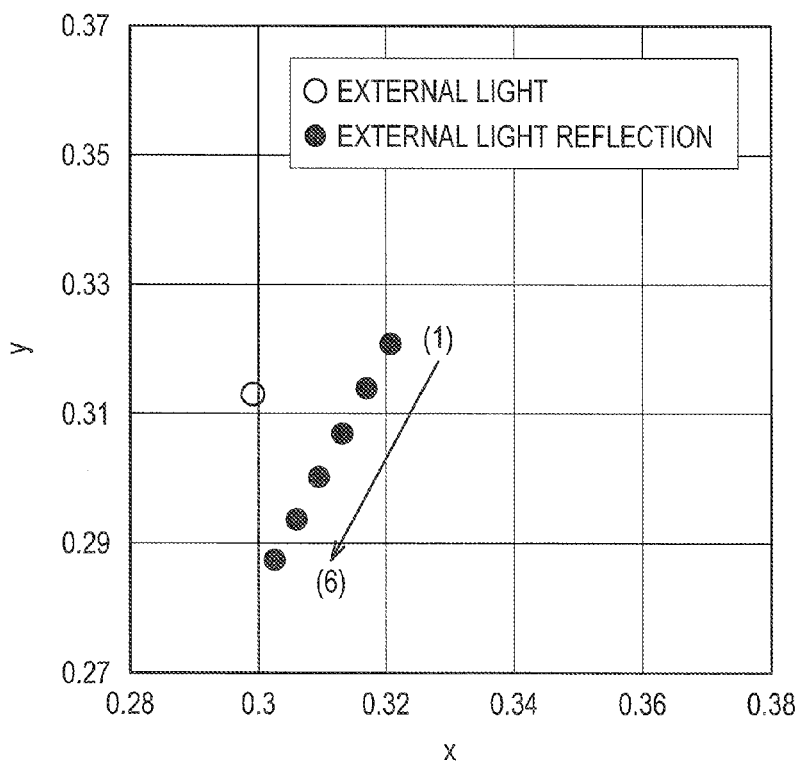
FIG. 15 is a characteristic chart illustrating xy chromaticities of the reflected light in the use of the white color filters (1) to (6) in FIG. 14.
Figure 16:
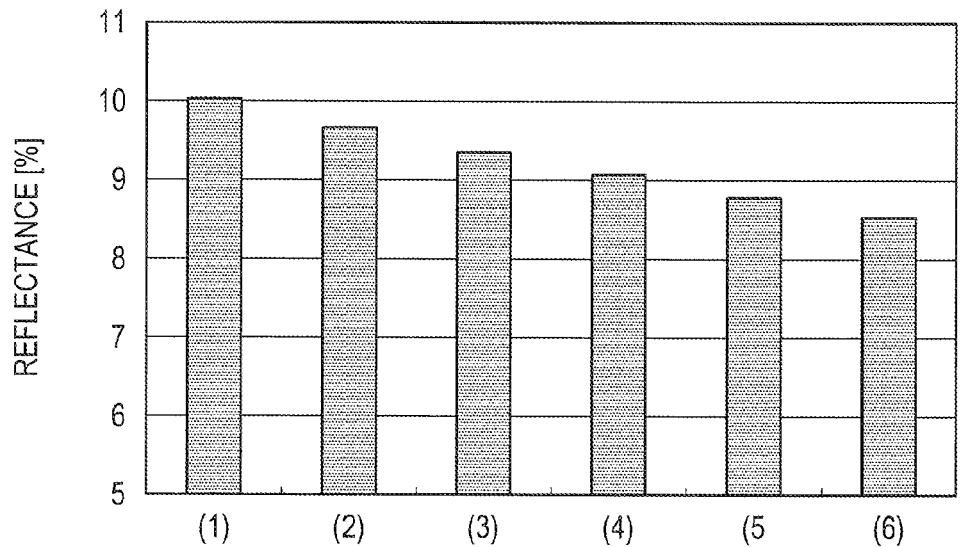
FIG. 16 is a characteristic chart illustrating absolute reflectances in the use of the white color filters (1) to (6) in FIG. 14.

FIG. 15 is a characteristic chart illustrating xy chromaticities of the reflected light in the use of the color filters 200W ((1) to (6)) in FIG. 14. As illustrated in FIG. 15, the hue of the reflected light is shifted in the direction of the coloring agents by increasing the density of the corresponding coloring agent. FIG. 16 is a characteristic chart illustrating absolute reflectances of the external light in the use of the white color filters (1) to (6) in FIG. 14. As illustrated in FIG. 16, each absolute reflectance is decreased by increasing the density of the coloring agent.

1.4. Allowable Range of Color Change

Figure 17:
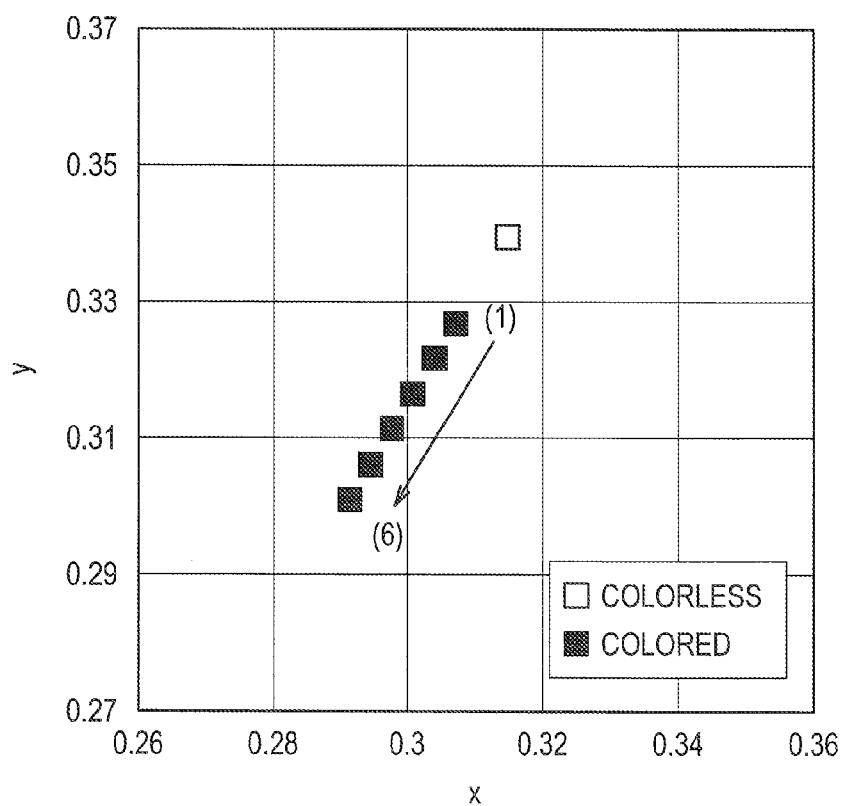
FIG. 17 is a characteristic chart illustrating xy chromaticities of the organic-EL intrinsic light from a white pixel only lit in the use of the white color filters (1) to (6) in FIG. 14.

FIG. 17 shows xy chromaticities of the organic-EL intrinsic light from a white pixel only lit in the use of the color filters 200W ((1) to (6)) in FIG. 14. In calculating the chromaticities in FIG. 17, an emission spectrum of a general organic EL is used. Generally, a difference in color change amount that is $\Delta u'v' \leq 0.02$ is said to be allowable with human eyes and is widely used as an index of chromaticity viewing angle characteristics of a display. Accordingly, it is desirable that a color difference in organic-EL intrinsic light from the white pixel only lit between the case where the color filter 200W is colorless and transparent and the case where a coloring agent is added in the color filter 200W should fulfill $\Delta u'v' < 0.02$.

Here, a u'v' color space is a color space in which an xy color space is changed to perceptually uniform, and is expressed as the following formula. Note that the xy chromaticity chart is not perceptually uniform. A distance in the u'v' color space is referred to as a color difference $\Delta u'v'$. For example, having the same value of $\Delta u'v'$ means almost no difference between colors perceived by a human with the eyes.

$$u' = \frac{4x}{-2x + 12y + 3}$$

$$v' = \frac{9y}{-2x + 12y + 3}$$

Figure 18:
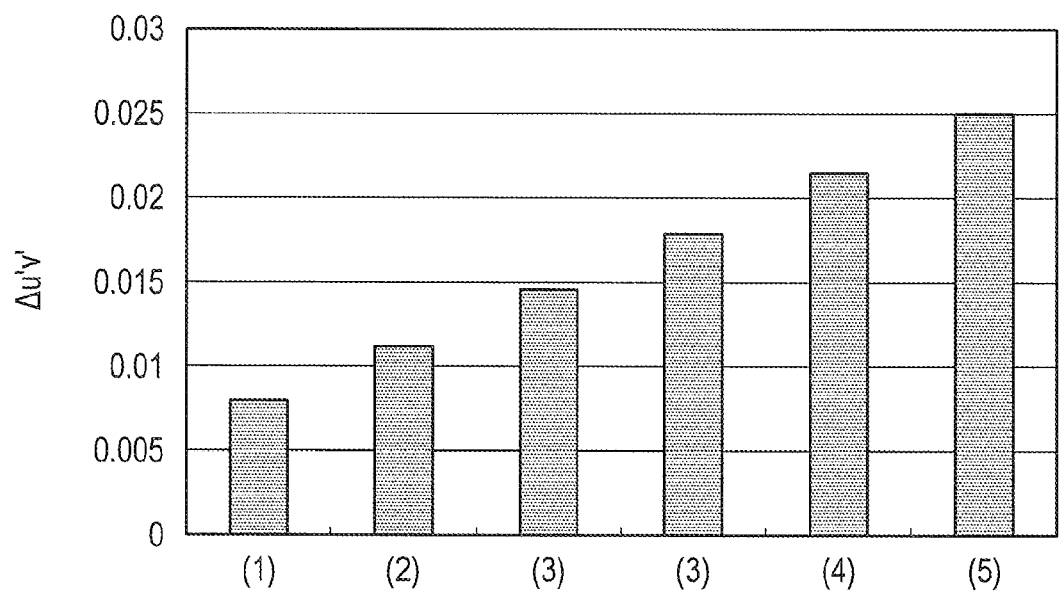
FIG. 18 is a characteristic chart illustrating a color difference Δu'v' in organic-EL intrinsic light from a white pixel only lit between the use of each of the white color filters (1) to (6) in FIG. 14 and the use of a colorless and transparent white color filter.

FIG. 18 is a characteristic chart illustrating a color difference $\Delta u'v'$ in organic-EL intrinsic light from the white pixel only lit between the use of each color filter 200W ((1) to (6)) in FIG. 14 and the use of the colorless and transparent white color filter. As illustrated in FIG. 18, the color difference $\Delta u'v'$ exceeds 0.02 when the white color filter (5) is used, and the color difference $\Delta u'v'$ is in a range not higher than 0.02 when the white color filter (4) is used. Thus, the density of the coloring agent is preferably not higher than a range between the densities of the white color filters (4) and (5).

Figure 19:
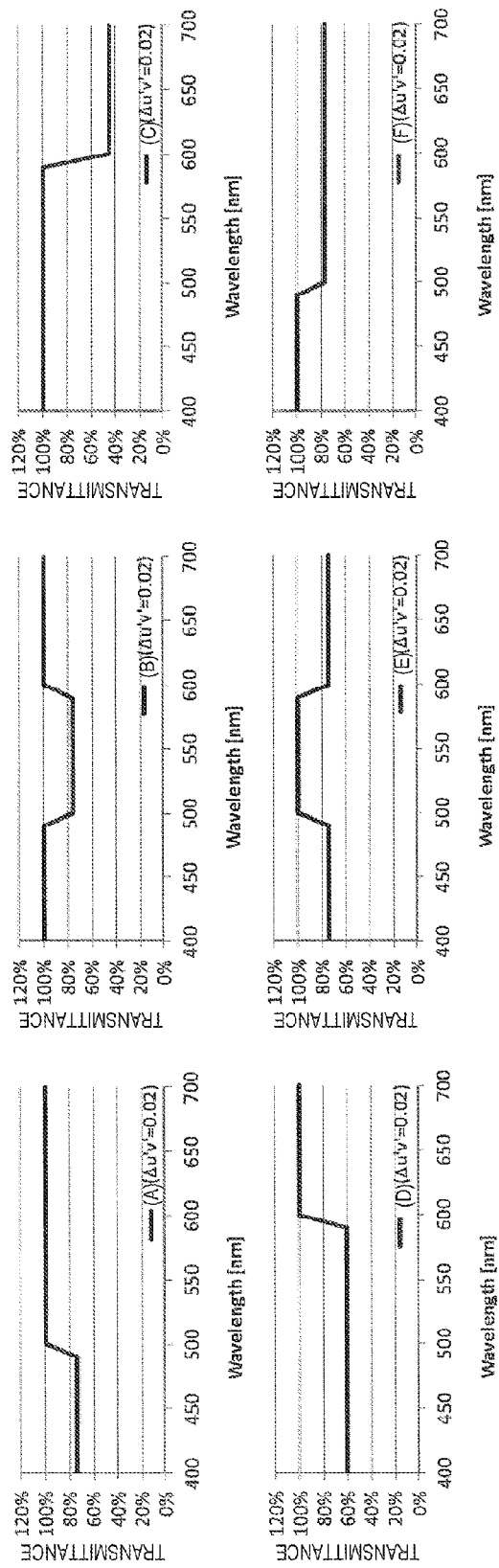
FIG. 19 is a characteristic chart illustrating spectral transmittances each leading to a color difference Δu'v' of 0.02 or lower at the time of changing a density of a coloring agent of each of the white color filters (A) to (F) illustrated in FIG. 11.

FIG. 19 is a characteristic chart illustrating spectral transmittances each leading to the color difference $\Delta u'v'$ of 0.02 or lower at the time of changing the density of the coloring agent of each of the white color filters 200W ((A) to (F)) illustrated in FIG. 11. More specifically, FIG. 19 illustrates spectral transmittances each leading to the color difference $\Delta u'v'$ of 0.02 or lower in the organic-EL intrinsic light from the white pixel only lit between the case where the coloring agent density of each of the white color filters 200W is changed and the case where the colorless and transparent white color filter 200W is used.

As illustrated in FIG. 19, the ratio of the maximum transmittance to the minimum transmittance in the 400-700 nm wavelength band at the time of changing the coloring agent density of the corresponding white color filter 200W ((A) to (F)) in (A) is 74%; (B), 76%; (C), 44%; (D), 61%; (E), 82%; and (F), 85%.

In the color filters 200W ((A) to (F)) in the six typical colors illustrated in FIG. 19, the minimum value of the ratio of the maximum transmittance to the minimum transmittance in the 400-700 nm wavelength band is 44% in (C). Accordingly, the ratio of the maximum transmittance to the minimum transmittance is preferably 44% or higher in the 400-700 nm wavelength band. This enables the color difference Δu'v' to be 0.02 or lower in the use of the corresponding color filter 200W. Since the white pixel only has to be lit for displaying white in this way, power consumption can be reduced. In addition, even if a pixel other than the white pixel is lit in an auxiliary manner to correct color change of a white signal, increase of the power consumption can be minimized.

In addition, the spectral transmittance of the white color filter depends on the structure or the emission spectrum of the organic EL panel 1000. Even though the spectral transmittance is not within the aforementioned range (the ratio of the maximum transmittance to the minimum transmittance is 44% or higher), the color difference in organic-EL intrinsic light from the white pixel only lit between the use of the colored color filter 200W and the use of the colorless and transparent white color filter may be in a range of the color difference Δu'v'≤0.02.

According to the first embodiment as described above, it is possible to effectively control the absolute reflectance and the hue of the external light reflection while minimizing influence on the brightness and the hue of the intrinsic light in the organic EL panel 1000.

<2. Second Embodiment>

Next, a second embodiment of the present disclosure will be described. In the second embodiment, the brightness of the white pixel is adjusted by decreasing the aperture ratio of the white pixel of the organic EL panel 1000. This enables reduction of the external light reflectance.

Figure 20:
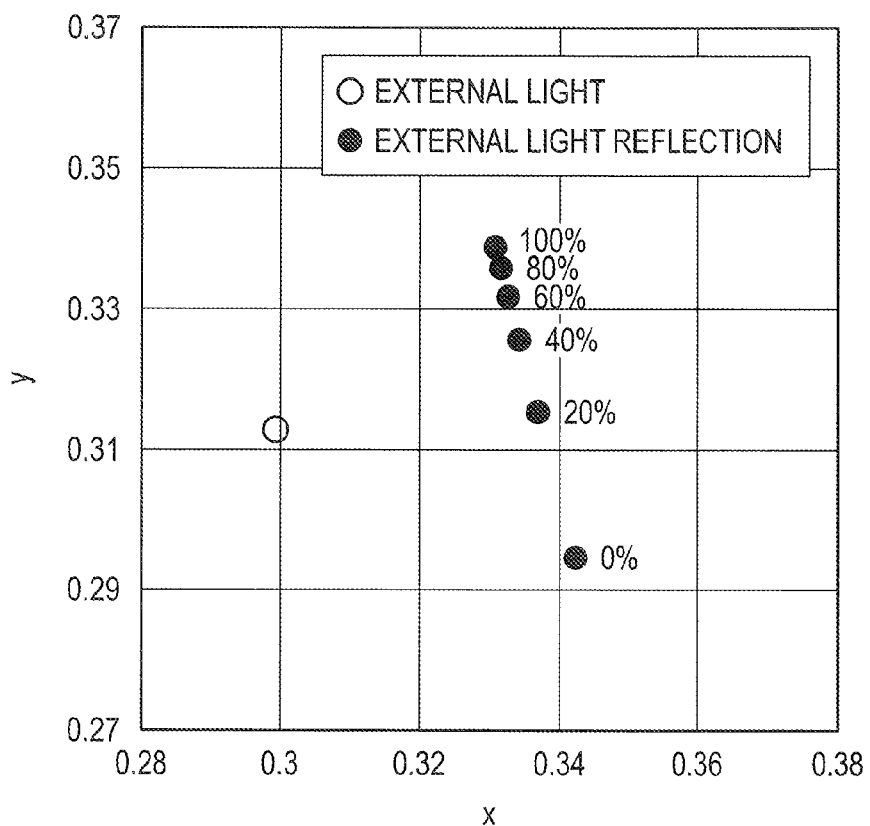
FIG. 20 is a characteristic chart illustrating xy chromaticities of external light reflection in a case where an aperture ratio of each of red, green, and blue pixels is fixed at 32% and where an aperture-ratio ratio of a colorless and transparent white pixel (the ND transmittance is 100%) is set at 100%, 80%, 60%, 40%, 20%, and 0%.
Figure 21:
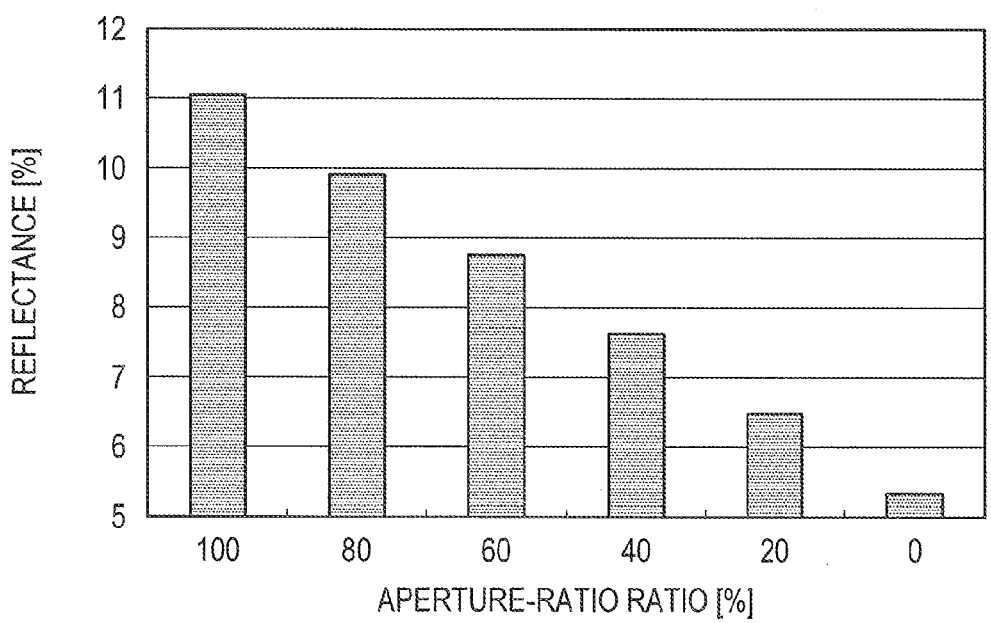
FIG. 21 is a characteristic chart illustrating absolute reflectances in the case where the aperture ratio of each of the red, green, and blue pixels is fixed at 32% and where the aperture-ratio ratio of the colorless and transparent white pixel (the ND transmittance is 100%) is set at 100%, 80%, 60%, 40%, 20%, and 0%.

FIG. 20 is a characteristic chart illustrating xy chromaticities of external light reflection in a case where the aperture ratio of each of the red, green, and blue pixels is fixed at 32% and where an aperture-ratio ratio of the colorless and transparent white pixel (the ND transmittance is 100%) is set at 100%, 80%, 60%, 40%, 20%, and 0%. Likewise, FIG. 21 is a characteristic chart illustrating absolute reflectances in the case where the aperture ratio of each of the red, green, and blue pixels is fixed at 32% and where the aperture-ratio ratio of the colorless and transparent white pixel (the ND transmittance is 100%) is set at 100%, 80%, 60%, 40%, 20%, and 0%. Here, the aperture-ratio ratio indicates a ratio of the aperture ratio of the white pixel to the aperture ratio (32%) of the red, green, and blue pixels. For example, the aperture-ratio ratio of 50% in the case where the aperture ratio of the red, green, and blue pixels is 32% means that the aperture ratio of the white pixel is 16%. As illustrated in FIG. 21, the reflectance of the external light can be reduced by decreasing the aperture ratio of only the white pixel. In contrast, as illustrated in FIG. 20, an amount of the reflected light is changed by changing the aperture ratio of only the white pixel, and thus the hue of the external light reflection is changed. Nevertheless, the color of the reflected light can be controlled by adding an appropriate coloring agent as shown in the first embodiment.

Figure 22:
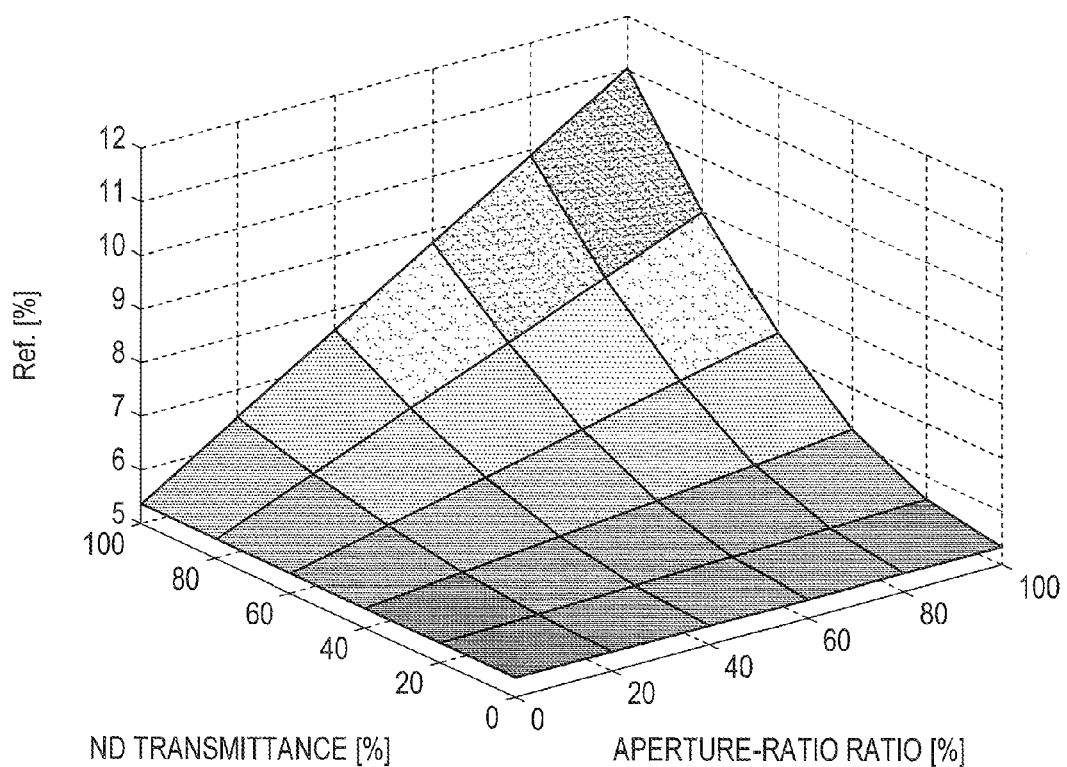
FIG. 22 is a characteristic chart illustrating absolute reflectances (on a vertical axis) of the external light each relative to the aperture-ratio ratio of a white pixel and the ND transmittance.

Here, assume a case where the aperture ratio of the white pixel is set to be lower than the aperture ratio (32%) of the red, green, and blue pixels to obtain the aperture-ratio ratio of 100% or lower and where the ND transmittance of the color filter 200W is decreased. FIG. 22 shows absolute reflectances (on the vertical axis) of the external light each relative to the aperture-ratio ratio of a white pixel and the ND transmittance. As illustrated in FIG. 22, it is learned that desirable absolute reflectance can be obtained by optimally changing the aperture-ratio ratio of the white pixel and the ND transmittance.

Figure 23:
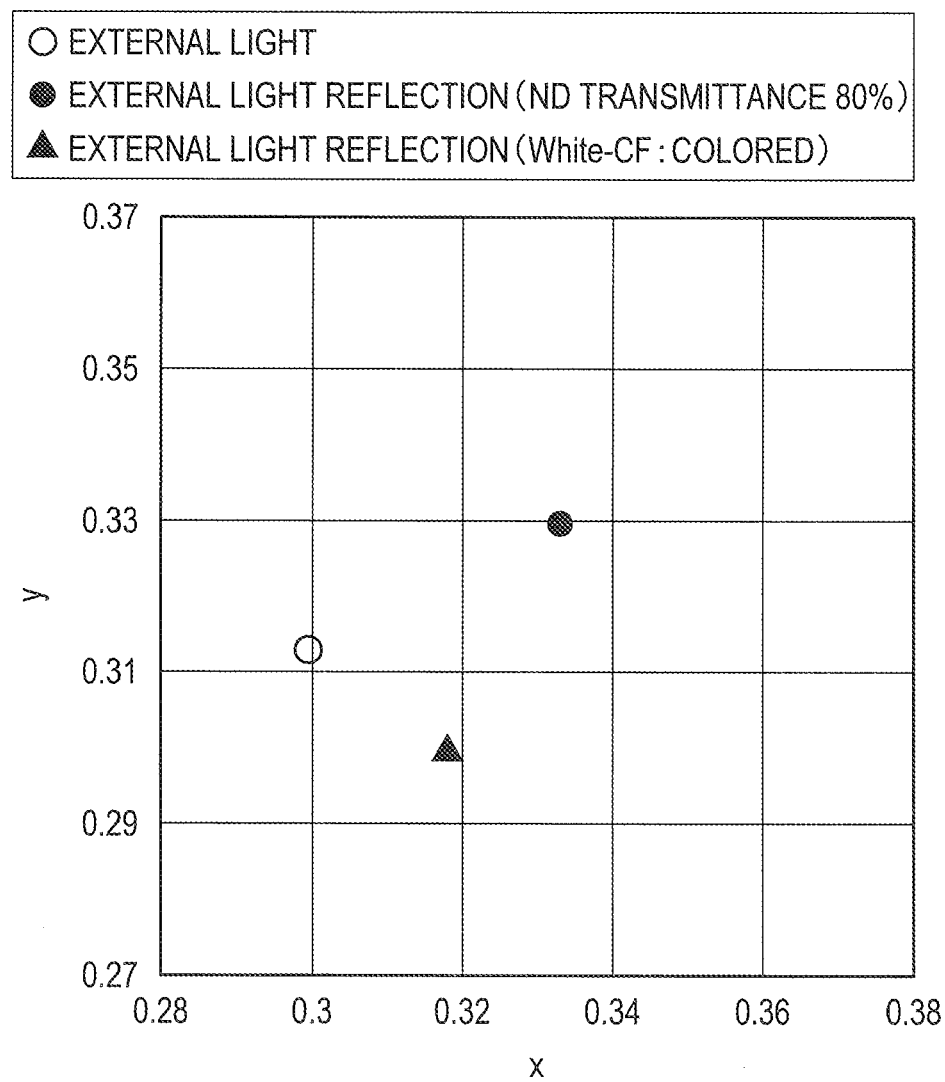
FIG. 23 is a characteristic chart illustrating xy chromaticies of the external light reflection in a case where the aperture-ratio ratio of the white pixel is 80% in the use of the white color filter (F) (the ND transmittance is 80%) illustrated in FIG. 11.

FIG. 23 is a characteristic chart illustrating xy chromaticies of the external light reflection in a case where the aperture-ratio ratio of the white pixel is 80% in the use of the white color filter 200W (F) (the ND transmittance is 80%) illustrated in FIG. 11. In FIG. 23, a black circle shows a characteristic of the external light reflection on the white color filter 200W (F), and a black triangle shows a case where the white color filter 200W (F) is colored by adding a coloring agent thereto. As illustrated in FIG. 23, also in the case where the aperture-ratio ratio of the white pixel and the ND transmittance are changed, the hue of the external light reflection can be controlled by coloring the white color filter 200W.

Note that in the present embodiment, the pixel aperture ratio of the red, green, and blue pixels is 32% but is not limited to 32%.

According to the second embodiment as described above, the external light reflectance can be decreased by decreasing the aperture ratio of the white pixel to the aperture ratio of the red, green, and blue pixels. Also in this case, the hue of the external light reflection can be controlled by coloring the white color filter 200W.

<3. Third Embodiment>

Figure 24:
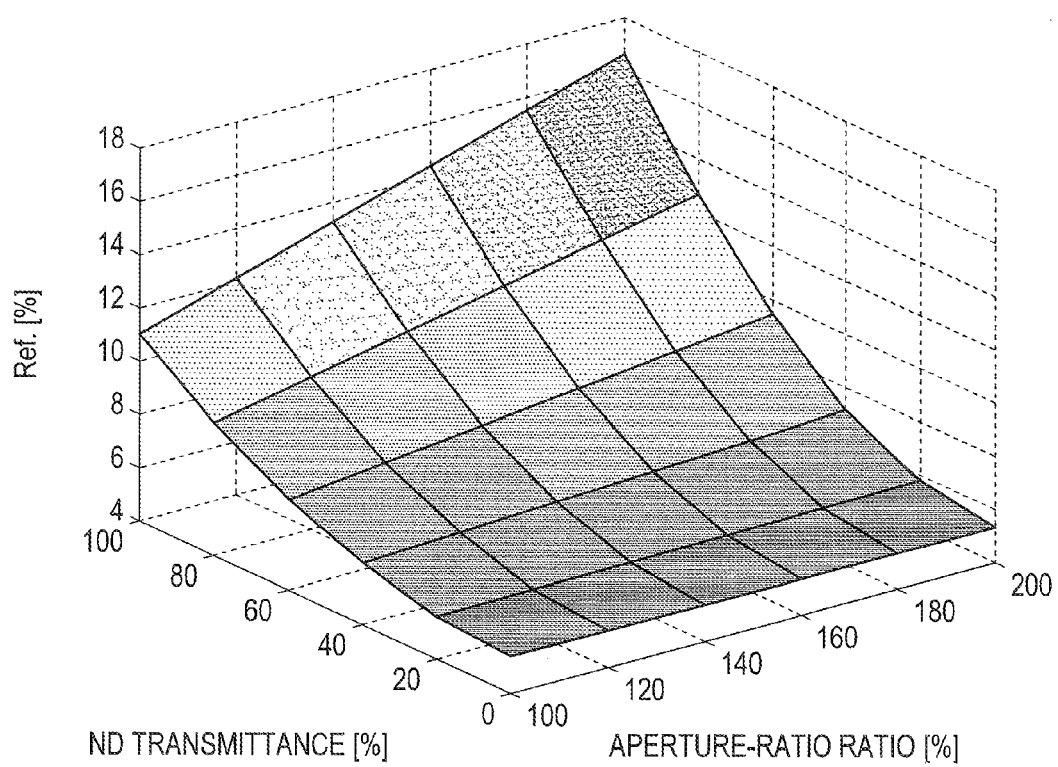
FIG. 24 is a characteristic chart illustrating a relationship among the aperture-ratio ratio, the ND transmittance, and external light reflectance.

Next, a third embodiment of the present disclosure will be described. In the third embodiment, the external light reflection is reduced by increasing the aperture-ratio ratio of the white pixel and by decreasing the ND transmittance. FIG. 24 is a characteristic chart illustrating a relationship among the aperture-ratio ratio, the ND transmittance, and the external light reflectance, like FIG. 22. FIG. 24 illustrates absolute reflectances of the external light reflection in the case where the aperture-ratio ratio of the white pixel is set at 100%, 120%, 140%, 160%, 180%, and 200%.

The external light reflectance can be decreased in this way. Specifically, the aperture ratio of the red, green, and blue pixels is fixed, the aperture-ratio ratio of only the white pixel is increased, and the ND transmittance is decreased. Also in this case, the hue of the reflected light can be controlled by coloring the white color filter 200W when the aperture-ratio ratio and the ND transmittance are changed, like the second embodiment.

In addition, the hue and the reflectance of the external light may be adjusted by setting any aperture ratio of not only the white pixel but also the red, green, and blue pixels. For example, when a reddish tint of the external light reflection is desired to be reduced, for example, the aperture ratio of the red pixel may be relatively decreased to control the hue.

<4. Fourth Embodiment>

Next, a fourth embodiment according to the present disclosure will be described. In the fourth embodiment, the hue of the external light reflection is optimally controlled depending on the structure or material of a device.

Figure 25:
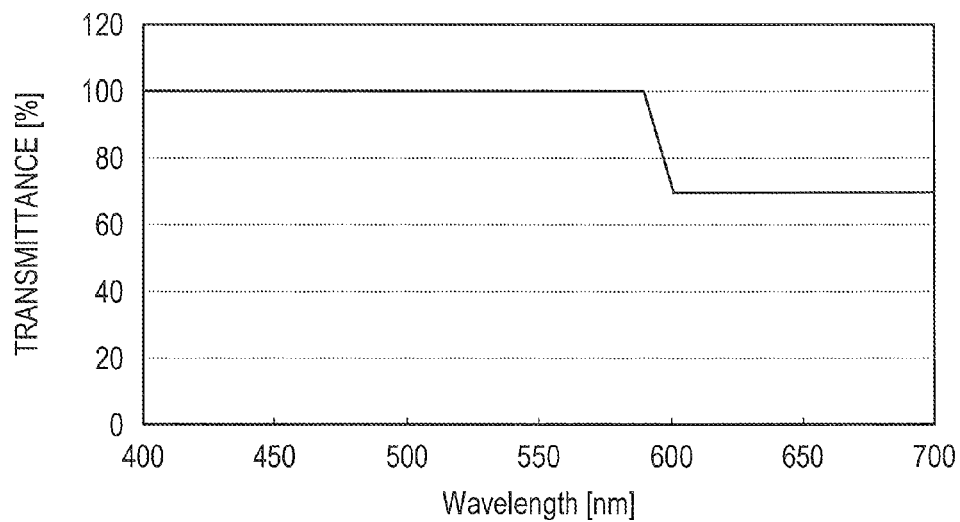
FIG. 25 is a characteristic chart illustrating spectral transmittances obtained by coloring the white color filter.
Figure 26:
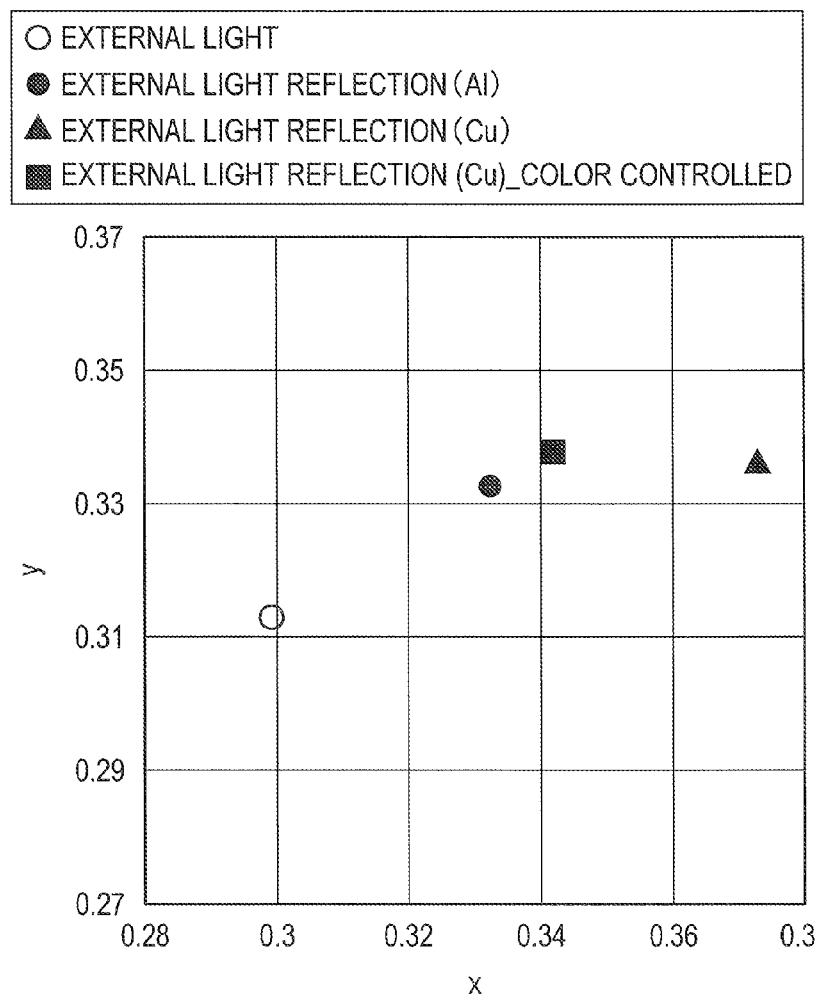
FIG. 26 is a characteristic chart illustrating xy chromaticities of external light reflection in a fourth embodiment.

As described in the first embodiment, the control can be performed on the hue of the external light reflection to have any of various colors, and is also effective, for example, when the structure or material of the device is changed. FIG. 26 is a characteristic chart illustrating xy chromaticities of the external light (a white circle) and reflection of the external light. The external light reflection is based on the cases where: the material of the metal electrode 700 is aluminum (Al) (a black circle); the material is copper (Cu) (a black triangle); and the material is copper (Cu) and the color of the metal electrode 700 is controlled (a black square). For example, assume that the material of the metal electrode 700 is changed from aluminum (Al) to copper (Cu). As illustrated in FIG. 26, the color of the reflected external light is shifted in a red direction (the black triangle). In this case, the white color filter is colored to obtain the spectral transmittance as illustrated in FIG. 25, and thereby the hue of the reflected light can be made to approximate the hue thereof in the case where the material of the metal electrode 700 is aluminum (Al) (the black square).

Also when the color of the reflected external light is changed depending on the structure or material of the device as described above, the reflected light in a desired color can be obtained by adding a coloring agent to the color filter 200W.

<5. Fifth Embodiment>

Figure 27:
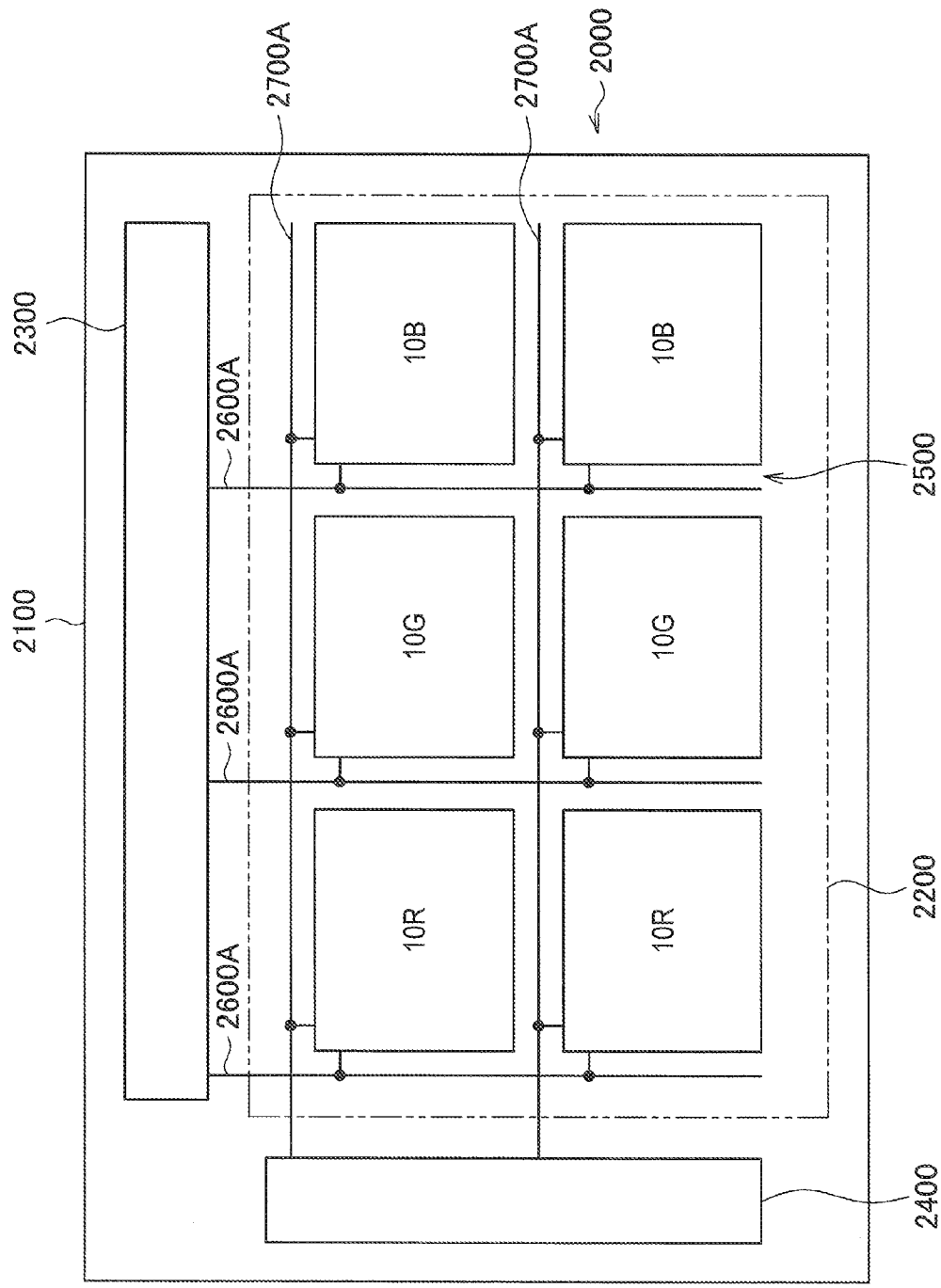
FIG. 27 is a schematic diagram illustrating a circuit configuration of a display device including an organic EL panel.

FIG. 27 is a schematic diagram illustrating a circuit configuration of a display device 2000 including the organic EL panel 1000. In the display device 2000, a plurality of red pixels 10R, green pixels 10G, and blue pixels 10B provided in a matrix form and various drive circuits for driving these pixels 10R, 10G, and 10B are formed on a driving panel 1100. Each of the pixels 10R, 10G, and 10B includes the organic EL element 600 configured to emit color light of a corresponding one of red (R), green (G), and blue (B). A display region 2200 included in the organic EL panel 1000 includes a plurality of pixels each formed by these three pixels 10R, 10G, and 10B. On the driving panel 1100, for example, a signal-line drive circuit 2300, and a scan-line drive circuit 2400, and a pixel drive circuit 2500 that are video display drivers are provided as the drive circuits. An encapsulating panel not shown in the figure is bonded to the driving panel 1100, which encapsulates the pixels 10R, 10G, and 10B and the drive circuits.

Figure 28:
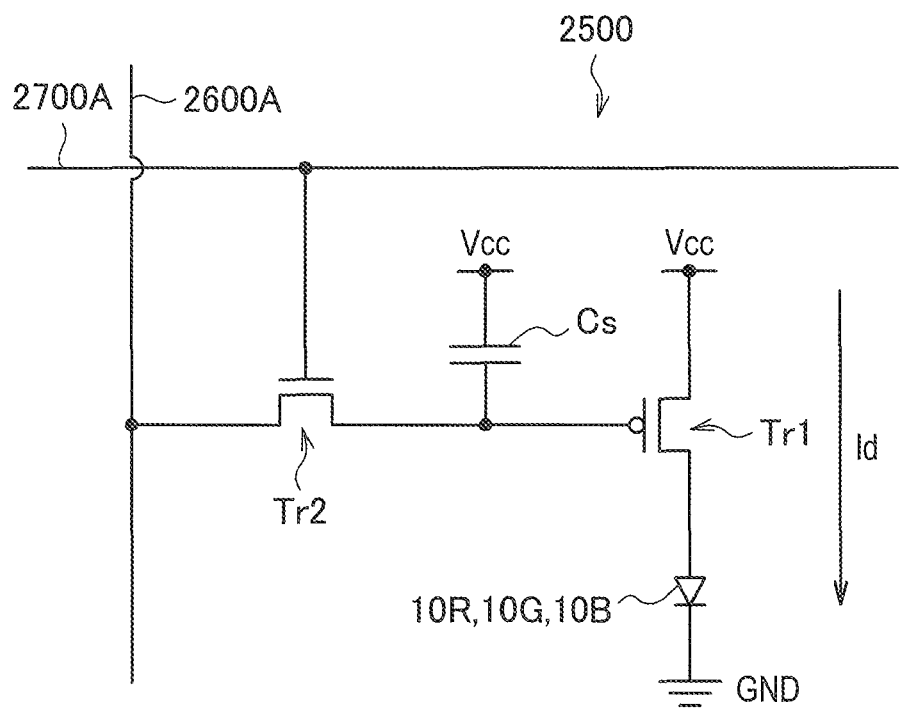
FIG. 28 is an equivalent circuit diagram of a pixel drive circuit.

FIG. 28 is an equivalent circuit diagram of the pixel drive circuit 2500. The pixel drive circuit 2500 is an active drive circuit provided with transistors Tr1 and Tr2 as thin-film transistors. A capacitor Cs is provided between the transistors Tr1 and Tr2, and the pixel 10R (or the pixel 10G or 10B) is connected to the transistor Tr1 in series between a first power line (Vcc) and a second power line (GND). In the pixel drive circuit 2500 as described above, a plurality of signal lines 2600A are each arranged to extend in a column direction, and a plurality of scan lines 2700A are each arranged to extend in a row direction. Each signal line 2600A is connected to the signal-line drive circuit 2300, and each of image signals is supplied from the signal-line drive circuit 2300 to a source electrode of the transistor Tr2 through the signal line 2600A. Each scan line 2700A is connected to the scan-line drive circuit 2400, and each of scan signals is serially supplied from the scan-line drive circuit 2400 to a gate electrode of the transistor Tr2 through the scan line 2700A. The display device 2000 as described above can be installed in an electronic device such as a television device, a digital camera, a notebook PC, a video camera, or a mobile phone (a mobile device).

It should be understood by those skilled in the art that various modifications, combinations, sub-combinations and alterations may occur depending on design requirements and other factors insofar as they are within the scope of the appended claims or the equivalents thereof.

In addition, the advantageous effects described in the specification are merely explanatory or illustrative, and are not limited. In other words, the technology according to the present disclosure can exert other advantageous effects that are clear to those skilled in the art from the description of the specification, in addition to or instead of the advantageous effects described above.

Additionally, the present technology may also be configured as below.

(1) A display device including:
a light-emitting element corresponding to a pixel for a color; and
a white color filter corresponding to a white pixel,
wherein transmittance of the white color filter is based on neutral density (ND) transmittance that is uniform throughout an entire wavelength band of visible light, and transmittance in a particular wavelength band in the entire wavelength band of the visible light is decreased to be lower than the ND transmittance.

(2) The display device according to (1),
wherein the transmittance in the particular wavelength band is decreased to be lower than the ND transmittance of the white color filter by adding a coloring agent to the white color filter.

(3) The display device according to (1),
wherein the ND transmittance is 50% or higher.

(4) The display device according to (1),
wherein the entire wavelength band of the visible light ranges from 400 nm to 700 nm.

(5) The display device according to (1),
wherein the white color filter is colored in one of red, green, and blue or in one of complementary colors of red, green, and blue.

(6) The display device according to (1), wherein a ratio of a maximum value to a minimum value of spectral transmittance in the entire wavelength band of the visible light is 0.44 or higher in the white color filter.

(7) The display device according to (1),
wherein a color difference $\Delta u'v'$ is 0.02 or lower, the color difference $\Delta u'v'$ being between organic-electroluminescence (EL) intrinsic light emitted from the light-emitting element that is an organic EL element and transmitted through the white color filter and organic-EL intrinsic light transmitted through a colorless and transparent white color filter having ND transmittance that is uniform throughout the entire wavelength band of the visible light.

(8) The display device according to (1),
wherein an aperture ratio of the white pixel corresponding to the white color filter is different from aperture ratios of red, green, and blue pixels.

(9) The display device according to (8),
wherein the aperture ratio of the white pixel corresponding to the white color filter is lower than the aperture ratios of red, green, and blue pixels.

(10) The display device according to (8),
wherein the aperture ratio of the white pixel corresponding to the white color filter is higher than the aperture ratios of red, green, and blue pixels.

(11) An electronic device including:
a display device including
a light-emitting element corresponding to a pixel for a color, and
a white color filter corresponding to a white pixel,
wherein the white color filter is based on neutral density (ND) transmittance that is uniform throughout an entire wavelength band of visible light, and transmittance in a particular wavelength band in the entire wavelength band of the visible light is decreased to be lower than the ND transmittance.

(12) The electronic device according to (11),
wherein the transmittance in the particular wavelength band is decreased to be lower than the ND transmittance of the white color filter by adding a coloring agent to the white color filter.

(13) The electronic device according to (11),
wherein the ND transmittance is 50% or higher.

(14) The electronic device according to (11),
wherein the entire wavelength band of the visible light ranges from 400 nm to 700 nm.

(15) The electronic device according to (11),
wherein the white color filter is colored in one of red, green, and blue or in one of complementary colors of red, green, and blue.

(16) The electronic device according to (11),
wherein a ratio of a maximum value to a minimum value of spectral transmittance in the entire wavelength band of the visible light is 0.44 or higher in the white color filter.

(17) The electronic device according to (11),
wherein a color difference Δu'v' is 0.02 or lower, the color difference Δu'v' being between organic-electroluminescence (EL) intrinsic light emitted from the light-emitting element that is an organic EL element and transmitted through the white color filter and organic-EL intrinsic light transmitted through a colorless and transparent white color filter having ND transmittance that is uniform throughout the entire wavelength band of the visible light.

(18) The electronic device according to (11),
wherein an aperture ratio of the white pixel corresponding to the white color filter is different from aperture ratios of red, green, and blue pixels.

(19) The electronic device according to (18),
wherein the aperture ratio of the white pixel corresponding to the white color filter is lower than the aperture ratios of red, green, and blue pixels.

(20) The electronic device according to (18),
wherein the aperture ratio of the white pixel corresponding to the white color filter is higher than the aperture ratios of red, green, and blue pixels.

What is claimed is:

1. A display device comprising:
    a light-emitting element corresponding to a pixel for a color;
    a white color filter corresponding to a white pixel, wherein transmittance of the white color filter is based on neutral density (ND) transmittance that is uniform throughout an entire wavelength band of visible light; and
    a coloring agent in the white color filter, the coloring agent causing transmittance in a particular wavelength band in the entire wavelength band of the visible light to be decreased to be lower than the ND transmittance and causing a post-reflection chromaticity of external light after reflection of the external light inside the display device to become closer to a pre-reflection chromaticity of the external light before the reflection of the external light inside the display device.

2. The display device according to claim 1,
wherein the ND transmittance is 50% or higher.

3. The display device according to claim 1,
wherein the entire wavelength band of the visible light ranges from 400 nm to 700 nm.

4. The display device according to claim 1,
wherein the white color filter is colored in one of red, green, and blue or in one of complementary colors of red, green, and blue.

5. The display device according to claim 1,
wherein an aperture ratio of the white pixel corresponding to the white color filter is lower than aperture ratios of red, green, and blue pixels.

6. The display device according to claim 1,
wherein an aperture ratio of the white pixel corresponding to the white color filter is higher than aperture ratios of red, green, and blue pixels.

7. The display device according to claim 1, wherein a ratio of a maximum value to a minimum value of spectral transmittance in the entire wavelength band of the visible light is 0.44 or higher in the white color filter.

8. The display device according to claim 1, wherein an aperture ratio of the white pixel corresponding to the white color filter is different from aperture ratios of red, green, and blue pixels.

9. An electronic device comprising:
    a display device including
        a light-emitting element corresponding to a pixel for a color,
        a white color filter corresponding to a white pixel, wherein the white color filter is based on neutral density (ND) transmittance that is uniform throughout an entire wavelength band of visible light, and
        a coloring agent in the white color filter, the coloring agent causing transmittance in a particular wavelength band in the entire wavelength band of the visible light to be decreased to be lower than the ND transmittance and causing a post-reflection chromaticity of external light after reflection of the external light inside the display device to become closer to a pre-reflection chromaticity of the external light before the reflection of the external light inside the display device.

10. The electronic device according to claim 9,
wherein the ND transmittance is 50% or higher.

11. The electronic device according to claim 9,
wherein the entire wavelength band of the visible light ranges from 400 nm to 700 nm.

12. The electronic device according to claim 9,
wherein the white color filter is colored in one of red, green, and blue or in one of complementary colors of red, green, and blue.

13. The electronic device according to claim 9,
wherein an aperture ratio of the white pixel corresponding to the white color filter is lower than aperture ratios of red, green, and blue pixels.

14. The electronic device according to claim 9,
wherein an aperture ratio of the white pixel corresponding to the white color filter is higher than aperture ratios of red, green, and blue pixels.

15. The electronic device according to claim 9, wherein a ratio of a maximum value to a minimum value of spectral transmittance in the entire wavelength band of the visible light is 0.44 or higher in the white color filter.

16. The electronic device according to claim 9, wherein an aperture ratio of the white pixel corresponding to the white color filter is different from aperture ratios of red, green, and blue pixels.

* * * * *